United States Patent [19]

Derkits, Jr. et al.

[11] Patent Number: 4,637,129

[45] Date of Patent: Jan. 20, 1987

[54] SELECTIVE AREA III-V GROWTH AND LIFT-OFF USING TUNGSTEN PATTERNING

[75] Inventors: Gustav E. Derkits, Jr., New Providence; James P. Harbison, Summit, both of N.J.

[73] Assignee: AT&T Bell Laboratories, Murray Hill, N.J.

[21] Appl. No.: 635,902

[22] Filed: Jul. 30, 1984

[51] Int. Cl.[4] .................. H01L 21/20; H01L 21/302
[52] U.S. Cl. ........................... 29/578; 29/576 E; 29/58 D; 148/174; 148/175; 148/DIG. 26; 148/DIG. 50; 148/DIG. 105; 148/DIG. 169; 156/643; 156/652; 156/653; 156/656; 156/659.1; 156/660; 156/612; 156/DIG. 103; 427/90; 427/91
[58] Field of Search ............... 29/578, 580, 576 E; 148/174, 175, DIG. 105, DIG. 169, DIG. 26, DIG. 50; 156/643, 652, 653, 656, 659, 660, 612, DIG. 103; 427/90, 91

[56] References Cited

U.S. PATENT DOCUMENTS

| 3,306,788 | 2/1967 | Sterling et al. | 148/DIG. 105 |
| 3,634,150 | 1/1972 | Horn | 148/175 |
| 3,909,319 | 9/1975 | Fujiwara et al. | 148/187 |
| 4,111,725 | 9/1978 | Cho et al. | 148/175 |
| 4,301,233 | 11/1981 | Calviello | 156/656 X |
| 4,326,911 | 4/1982 | Howard et al. | 156/662 X |
| 4,404,732 | 9/1983 | Andrade | 29/578 X |
| 4,426,767 | 1/1984 | Swanson et al. | 156/662 X |
| 4,448,800 | 5/1984 | Ehara et al. | 156/662 X |
| 4,472,237 | 9/1984 | Deslauriers et al. | 156/656 X |
| 4,498,953 | 2/1985 | Cook et al. | 156/656 X |

OTHER PUBLICATIONS

Driver et al., "Gallium Arsenide Self-Aligned Gate Field-Effect Transistor" Proceedings IEEE (Letters) Aug. 1971, pp. 1244-1245.

Jackson et al., "Novel Submicron Fabrication Technique" IEDM, 1979, paper 3.6 (4 pages).

Imamura et al., "Wsi/Tin/Au Gate Self-Aligned—Mocvd" Jap. J. Applied Physics, vol. 23, No. 5, May 1984, pp. L342-L345.

"Dry Development of Se-Ge Inorganic Photoresist", Applied Physics Letters, 36(1), Jan. 1, 1980, A. Yoshikawa et al., pp. 107-109.

"GaAs Planar Technology by Molecular Beam Epitaxy (MBE)", Journal of Applied Physics, vol. 46, No. 2, Feb. 1975, A. Y. Cho et al., pp. 783-785.

Primary Examiner—William G. Saba
Attorney, Agent, or Firm—Richard D. Laumann

[57] ABSTRACT

A method of device fabrication using selective area regrowth Group III-V compound semiconductors with tungsten patterning is described.

13 Claims, 7 Drawing Figures

SELECTIVE AREA III-V GROWTH AND LIFT-OFF USING TUNGSTEN PATTERNING

FIELD OF THE INVENTION

This invention relates generally to semiconductor device fabrication and particularly to such device fabrication using selective area growth and lift-off with a metal such as tungsten.

BACKGROUND OF THE INVENTION

Semiconductor device fabrication requires techniques which grow one or more epitaxial layers on a substrate which is frequently referred to as a wafer. Accordingly, various epitaxial growth techniques have been developed including techniques such as liquid phase epitaxy and molecular beam epitaxy. The latter technique, commonly referred to as MBE, is capable of growing, for example, very thin layers with precisely controlled dimensions and doping concentrations.

However, for many device fabrication sequences, further processing of the layers is required after the first epitaxial layers are grown. This processing may include patterning of the surface by depositing a layer of resist and selectively forming openings in the resist, i.e., a pattern is formed in the resist which exposes portions of the surface of the top epitaxial layer. The now exposed suface may now be further processed by, for example, ion implanting in the exposed portions. Alternatively, the exposed material may be selectively removed.

Some processing steps might be eliminated and greater flexibility obtained in the device processing if single crystal material could be grown on selected areas of the wafer. Accordingly, selective area growth techniques have been developed. One such technique is described in the *Journal of Applied Physics*, 46, pp. 783–785, 1975. In this technique, a layer of amorphous $SiO_2$ is deposited on an epitaxial layer of a Group III-V compound semiconductor and patterned to expose selected portions of the epitaxial layer. During the subsequent growth by MBE, polycrystalline material is formed on the amorphous material while high quality singel crystal material grows in the exposed areas opened by the $SiO_2$ mask. This is a desirable structure because the polycrystalline semiconductor material is highly resistive, and can be used for dielectric isolation. That is, the single crystal material can be further processed to form devices which are electrically isolated from each other by the polycrystalline material.

While the above-described selective area growth technique is advantageously employed for many device fabrication steps, it is not fully satisfactory for all devices because some necessary fabrication steps cannot proceed unless the polycrystalline material is removed. The problem of removing polycrystalline material from the wafer may be avoided by using patterned Si shadow masks. The unwanted polycrystalline material is deposited on the mask and not on the wafer. These mechanical masks are not, however, totally practical for integrated circuit fabrication. Micron size features are involved, and, although masks with 1 $\mu$m features have been made, masks with complex patterns are difficult to fabricate. Additionally, successive processing steps require mask alignment with respect to the previous layer to within a fraction of a micron. Alignment is often made still more difficult because a silicon mask and a Group III-V compound semiconductor typically have different thermal expansion coefficients. These make precise alignment over large areas extremely difficult because it is difficult to maintain the wafer and mask at the same temperature.

One approach to solving the problem created by the presence of the polycrystalline material uses selective etches which remove the polycrystalline and single crystal material at different rates. Lift-off techniques are, however, preferable because they leave the selectively grown single crystal portions of the wafer unaffected, i.e., little or no single crystal material is removed. Such a lift-off technique has been demonstrated for GaAs MBE using $SiO_2$ as the masking material. See, for example, U.S. Pat. No. 4,111,725 issued on Sept. 5, 1978 to Cho, DiLorenzo and Mahoney.

While this is an attractive technique, it is somewhat disadvantageous because the wafer is typically removed from the ultra high vacuum MBE growth chamber to deposit the $SiO_2$. This means that the epitaxial layer may be contaminated after removal from the growth chamber and prior to deposition of the amorphous $SiO_2$ layer.

SUMMARY OF THE INVENTION

We have found that Group III-V semiconductor material may be patterned using a lift-off technique with a metal layer deposited on the semiconductor material, in, for example, an MBE vacuum chamber. The method comprises depositing a metal layer on a Group III-V semiconductor material, patterning said metal layer to expose selected portions of the semiconductor material and modifying the exposed material by, for example, depositing a Group III-V semiconductor through the openings in the mask formed by the patterned metal layer. All steps may be performed in an MBE vacuum system. The metal should have etching characteristics complementary to those of the semiconductor material. In one embodiment, semiconductor material is now deposited and a lift-off technique is used to remove both the mask material and the overlying polycrystalline semiconductor material leaving epitaxial semiconductor material on the initial semiconductor material. If desired, the described process may be repeated with the deposition of yet another epitaxial semiconductor layer. In a preferred embodiment, the metal layer comprises tungsten which is a preferred metal because it is relatively unreactive, even at relatively high temperatures, with the Group III-V semiconductors, and has a dry etching chemistry complementary to that of III-V semiconductor materials thereby making the entire patterning and lift-off processes amenable to plasma processing.

DETAILED DESCRIPTION

Our invention will be described specifically by reference to embodiments which use tungsten to pattern an epitaxial GaAs layer and regrow single crystal material through openings in the mask. Other embodiments will then be apparent to those skilled in the art. For reasons of clarity, the elements in the FIGURES are not drawn to scale.

Figure 1:
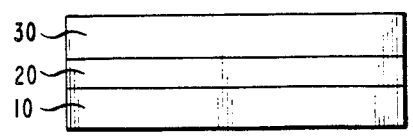
FIGS. 1–7 illustrate steps in variou steps of device processing in accordance with out invention.

FIG. 1 depicts a GaAs substrate 10, an element 20 which is an epitaxial GaAs layer and tungsten layer 30. The epitaxial GaAs layer 20 is grown conventionally by, for example, MBE on a GaAs substrate which has been suitably prepared such as by chemically polishing in, for example, bromine methanol, etched and then thermally cleaned at the desired growth temperature in an arsenic flux prior to growth.

Structures other than a GaAs layer on a GaAs substrate may be used. For example, element 20 may be a single or double heterostructure. Such structures have one or two junctions, respectively, between different semiconductors.

After the epitaxial layer has been grown, the metal layer is deposited over the entire wafer from an electron beam evaporation source which is desirably located in the same vacuum system. Evaporating the metal layer within the same vacuum system is desirable because it prevents any contamination of the epitaxial layer which might occur if the wafer were removed from the system. The tungsten need not be deposited in the growth chamber as deposition in a chamber connected to the growth chamber by a vacuum interlock is sufficient.

Tungsten may be evaporated either at the semiconductor growth temperature or the wafer may be cooled after growing the epitaxial layer, and the metal then deposited. Deposition of the metal layer at the elevated growth temperature is desirable because, for example, fewer residual impurities from the vacuum are likely to be deposited on the epitaxial surface. The high temperature deposition also appears to give better mechanical properties when deposited at temperatures above 400 degrees C. The thickness of the metal layer is desirably between 500 and 10,000 Angstroms. Thinner layers are undesirable because they are difficult to undercut when lift-off techniques are used.

Figure 2:
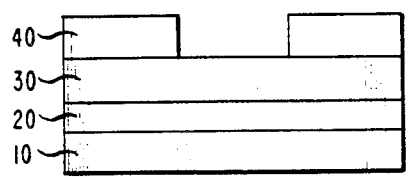

The metal layer is now patterned. This is typically done by depositing a layer of resist on the metal and selectively exposing the resist. The exposure modifies the properties of the resist so that the exposed and unexposed areas have different removal rates when subjected to an appropriate developer. Either the exposed or unexposed portion of the resist is now removed, depending upon whether the resist was positive or negative, to expose the underlying semiconductor material. For example, a layer of glassy $Ge_xSe_{1-x}$ may be evaporated over the tungsten layer. This is an inorganic resist and is described in, for example, *Applied Physics Letters*, 36, pp. 107-109, Jan. 1, 1980. A thin layer of $Ag_2Se$, typically 30 Angstroms, is now evaporated over the inorganic resist. The resist is selectively exposed to an ultraviolet light through a mask in the vacuum. The light drives the Ag ions into the resist layer and renders the exposed portions relatively unreactive as compared to the unexposed portions when the resist is subject to an appropriate developing agent. The unexposed portion of the layer is now removed, i.e., the resist is developed, by, for example, plasma or reactive ion etching. This yields the patterned structure depicted in FIG. 2 with layer 40 being the patterned resist. For reasons of clarity, only a portion of the patterned resist is depicted. It will be readily appreciated that a plurality of openings is typically formed.

Figure 4:
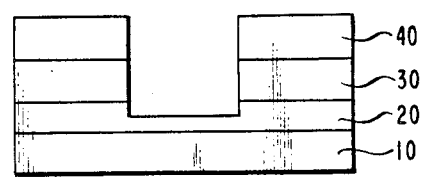
Figure 3:
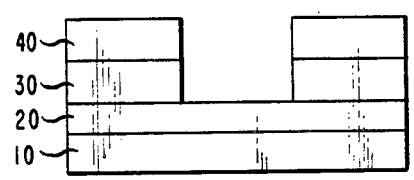

A $CF_4$ or $CF_4 + O_2$ plasma etch may be used to remove the underlying tungsten layer. This yields the patterned structure depicted in FIG. 3. These and other known fluorine containing plasma etches are desirably used because they stop at the surface of a Group III-V semiconductor because Group III elements such as Al, Ga and In form nonvolatile fluorides making these semiconductors practically unetchable in fluorine-based plasmas. It will also be appreciated that in some embodiments, another etch may be used which removes the now exposed semiconductor material without etching the metal layer. This yields the structure depicted in FIG. 4. Chlorine containing etches are desirably used for this step with Group III-V semiconductors. However, the portions of the semiconductor covered by the exposed $Ge_xSe_{1-x}$ will not be readily etched by either the fluorine or chlorine containing plasmas, and hence a pattern is obtained with a semiconductor layer exposed where the mask has shadowed the wafer and covered with a $W/Ge_xSe_{1-x}$ layer where light passed through the mask.

Figure 5:
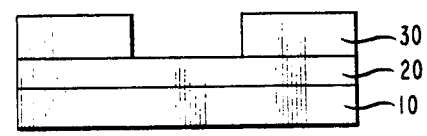

The $Ge_xSe_{1-x}$, i.e., the resist, layer is now evaporated, i.e., stripped, such as by thermal evaporation by, for example, heating to an appropriate temperature in vacuum. The structure is depicted in FIG. 5. There is now a patterned semiconductor surface ready for the next device processing step which modifies the exposed surface. Contemplated steps include semiconductor regrowth, metallization, dielectric deposition, thermal oxidation, selective plasma etching, ion implantation, etc.

The entire processing sequence described so far need not be performed in the growth chamber and modifications are contemplated. For example, after the metal layer has been deposited, the structure may be removed from the MBE system for patterning. For example, a standard photoresist may be spun onto the wafer and patterned. The resist is first patterned and then, for example, a plasma etch is used to remove the portions of the tungsten layer exposed by the resist patterning. After patterning the tungsten layer and stripping the remainder of the resist layer, the wafer, similar to that depicted in FIG. 4, may be reinserted into the MBE system.

If the semiconductor surface has residual impurities, such as several monolayers of oxygen, these layers may be removed by, for example, thermal desorption or selective area plasma etching prior to the next processing step to yield a clean surface. The clean surface is necessary for regrowth which results in, for example, planar structures. This cleaning step should be performed in either the growth chamber or a vacuum chamber connected to the growth chamber by an interlock.

Figure 6:
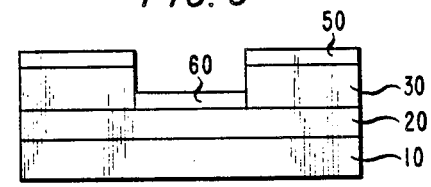

The epitaxial regrowth may now be performed. GaAs is now grown to yield the structure depicted in FIG. 6. A polycrystalline layer 50 is formed on the tungsten layer 30 while a single crystal GaAs layer 60 is formed on the GaAs layer 30. Other semiconductors which grow epitaxially on the GaAs may also be fabricated. Alternatively, two or more layers forming one or more heterojunctions may be grown. Regardless of the precise nature of the material grown, it should have a thickness less than that of the metal layer plus the depth of the etch-back.

A lift-off step is now performed using a fluorine based plasma such as that previously described. Since the GaAs is unetched by the plasma it is possible to undercut the tungsten layer at least several hundred microns without affecting the regrowth features. This amount of undercutting permits removal of the tungsten. This yields the structure depicted in FIG. 7.

Other metals are, however, useful. For example, molybdenum, tantalum and niobium may also be used. However, tungsten appears to be the preferred metal for several reasons. For example, it is the least reactive with III-V compound semiconductors. It is also thermally stable even for the elevated regrowth temperatures. Equally important as the thermal stability is the fact that it does not etch in chlorine-containing etches allowing selective patterned etching in a semiconductor before any subsequent steps. That is, it has etching characteristics complementary to those of the III-V semiconductors in chlorine-containing etches. This facilitates the fabrication of planar devices where holes would be etched in, with subsequent regrowth occuring in the holes back up to the planar surface. Additionally, tungsten has a high z making it useful as an ion implantation mask in applications such as MESFET gates used as a self-aligning mask for ion implanted source and drain contacts.

Figure 7:
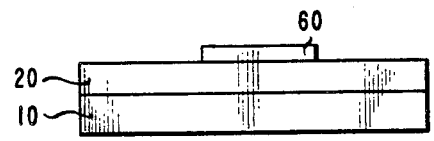

The structure depicted in FIG. 7 may now be further processed. For example, it may be coated with a metal, a resist and patterned, etc. That is, the entire device processing sequence described may be repeated.

Variations of the processing steps explicitly described will be readily thought of by those skilled in the art. For example, multilevel resists may be used. In some cases, this will result in improved resolution. Alternatively, a layer of SiO$_2$ may be deposited over the W. If this is done, SiO$_2$ patterning techniques may be used.

It will be readily appreciated that numerous types of devices may be fabricated by this processing technique. For example, lasers such as ridge waveguide or buried heterostructures may be fabricated. Additionally, transistors, such as MESFETs, JEETs, or heterojunction bipoles may be fabricated. Furthermore, p-i-n photodiodes may be fabricated.

What is claimed is:

1. A method of semiconductor device fabrication comprising the steps of:
    growing a Group III-V semiconductor structure;
    forming a metal layer on the surface of said Group III-V semiconductor structure, said growing and forming steps performed in the same vacuum system;
    pattern delineating said metal layer to expose a portion of the surface of said semiconductor structure;
    modifying the surface of said structure, said modifying step growing at least one Group III-V epitaxial layer; and
    removing said patterned metal layer.

2. A method as recited in claim 1 in which said metal is selected from the group consisting of tungsten, molybdenum, tantalum and niobium.

3. A method as recited in claim 2 in which said metal layer comprises tungsten.

4. A method as recited in claim 3 in which said modifying step comprises ion implanting.

5. A method as recited in claim 3 in which said modifying step comprises plasma etching said surface.

6. A method as recited in claim 5 in which said etching is with a chlorine-containing plasma.

7. A method as recited in claim 3 in which said modifying grows at least one Group III-V epitaxial layer by molecular beam epitaxy.

8. A method as recited in claim 1 in which said removing is by lift-off.

9. A method as recited in claim 1 in which said lift-off uses a fluorine containing plasma.

10. A method as recited in claim 3 in which said pattern delineating step uses an inorganic resist.

11. A method as recited in claim 10 in which said resist comprises Ge$_x$Se$_{1-x}$.

12. A method as recited in claim 1 comprising the further step of metallizing said surface.

13. A method as recited in claim 3 in which said forming step is performed at a temperature of at least 400 degrees C.

* * * * *